United States Patent [19]

Hosten

[11] Patent Number: 4,948,483

[45] Date of Patent: Aug. 14, 1990

[54] ELECTROPLATING APPARATUS FOR PLATE-SHAPED WORKPIECES, PARTICULARLY PRINTED CIRCUIT BOARDS

[75] Inventor: Daniel Hosten, Handzame, Belgium

[73] Assignee: Siemens Aktiengesellschaft, Berlin and Munich, Fed. Rep. of Germany

[21] Appl. No.: 394,725

[22] Filed: Aug. 16, 1989

[51] Int. Cl.$^5$ ............................................. C25D 17/00
[52] U.S. Cl. .................................................... 204/198
[58] Field of Search ................................. 204/198, 202

[56] References Cited

U.S. PATENT DOCUMENTS

| 4,385,967 | 5/1983 | Brady et al. | 204/27 |
| 4,755,271 | 7/1988 | Hosten | 204/198 |
| 4,776,939 | 10/1988 | Bläsing et al. | 204/202 |

Primary Examiner—T. M. Tufariello
Attorney, Agent, or Firm—Hill, Van Santen, Steadman & Simpson

[57] ABSTRACT

An improvement in an electroplating apparatus which has a conveyor arrangement which conveys a workpiece through an electrolyte bath with an edge portion of each of the workpieces extending laterally out of the bath in a sealed relationship and being engaged by a contact arrangement characterized by the contact arrangement being constructed as an endlessly moving belt having either brushes or contact spring pairs for engaging the edge of the workpiece. In addition, the belt is arranged to move over two pulleys to provide a run adjacent the edge and a return run which passes through a cleaning arrangement which is an electrolytic demetallization cell.

12 Claims, 1 Drawing Sheet

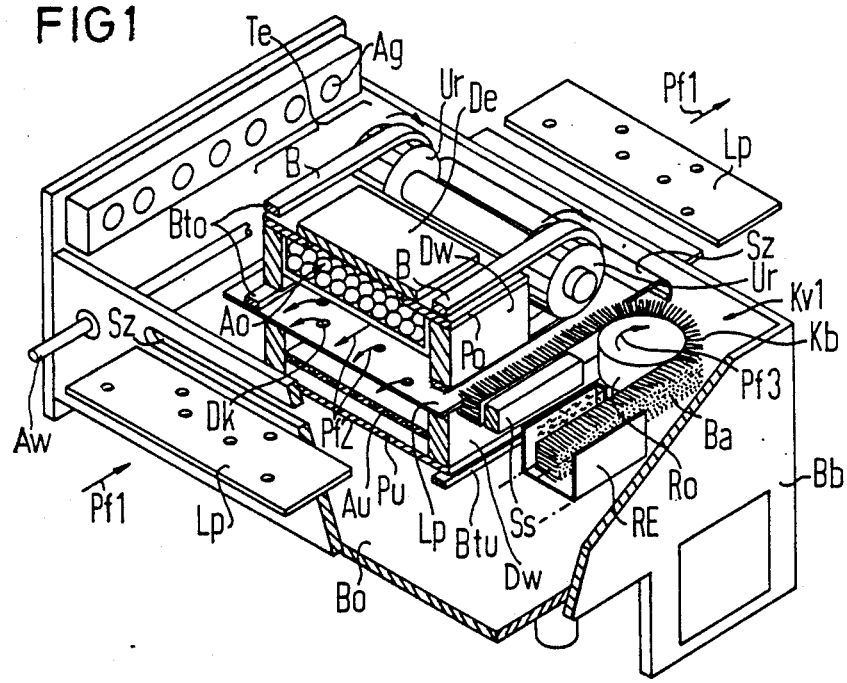
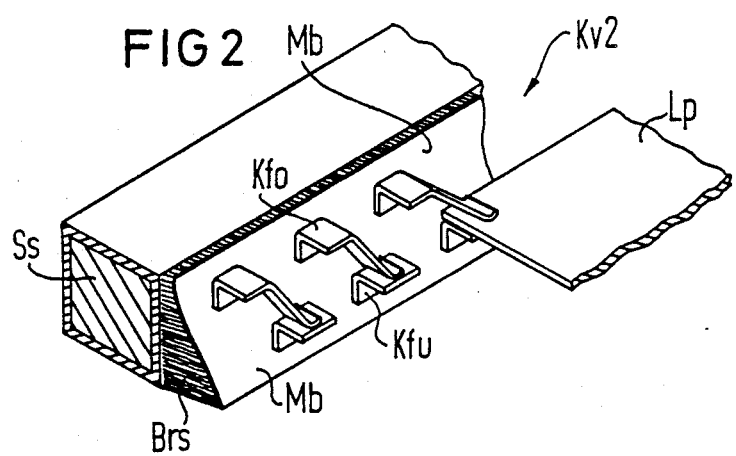

ELECTROPLATING APPARATUS FOR PLATE-SHAPED WORKPIECES, PARTICULARLY PRINTED CIRCUIT BOARDS

OTHER RELATED APPLICATIONS

This application is related to my copending application Serial No. 394,472, filed Aug. 16, 1989 pending, and to my copending application Serial No. 394,536, filed Aug. 16, 1989.

BACKGROUND OF THE INVENTION

The present invention is directed to an electroplating apparatus for plate-shaped workpieces, particularly printed circuit boards, which apparatus includes a container of an electrolytic material having a conveying arrangement for conveying a workpiece through the electrolyte solution in a horizontal path, at least one contacting mechanism arranged laterally relative to the transverse path for cathodic contacting of the workpiece and a cover arranged at the side of the transversal path for protecting the contact means of the contacting mechanism against access or contact with the electrolyte solution.

An electroplating apparatus is disclosed in U.S. Pat. No. 4,755,271, whose disclosure is incorporated by reference and which claims priority from the same German Application as European Patent Application A0 254 962. In this electroplating apparatus, a contacting mechanism for cathodic contacting of the workpiece is formed by forceps-shaped contact clamps, which are laterally offset with respect to the workpiece, and includes an endless drive preferably serves as a displaceable carrier for the contact clamps. At the beginning of the conveying path, means are provided to cause the grasping of the lateral edges of the workpiece by the contact clamps and at the end of the conveying path means are provided for causing the release of the workpiece by the contact clamps. The contact clamps, thus, can also act simultaneously to serve as a conveyor element for the throughput of the workpiece. The contact clamps are shielded against access or contact with the electrolyte solution by a seal that extends laterally in the throughput direction and presses resiliently against the respective workpieces.

U.S. Pat. No. 4,776,934, whose disclosure is incorporated by reference thereto and which is based on German Published Application 36 24 481, discloses another electroplating apparatus wherein a conveyor means is constructed as an endless circulating, driven row of individual conveyor elements that retain the lateral edges of the plate-shaped workpiece and move in a conveying direction. Means which cause the grasping of the plate-shaped workpieces by the conveyor elements or, respectively, cause the release of the plate-shaped workpiece by the conveyor elements, are provided at the beginning and the end of the conveyor path of the plate-shaped workpieces which are placed in the electrolyte chamber. Apart from the beginning of the grasping or, respectively, the beginning of the release, no relative movement between the conveyor elements and the workpiece edges occurs so that the wear phenomena or, respectively, abrasion phenomena of the conveyor elements are avoided. The conveyor elements can, thus, also simultaneously serve for the power supply to the plate-shaped workpiece.

SUMMARY OF THE INVENTION

The object of the present invention is to provide a contacting means for an electroplating apparatus which provides a reliable, cathodic contacting of the workpieces and has little cost.

For achieving this object, the invention is directed to an improvement in an electroplating apparatus for plate-shaped workpieces, particularly printed circuit boards, which has a container containing electrolyte and an anode, conveyor means for conveying the workpieces through the electrolyte solution in a horizontal path, at least one contacting means arranged laterally relative to the path for cathodic contacting of the workpiece, and a covering arranged laterally relative to the throughput path for protecting the contact means of the contacting arrangement against the access of electrolyte. The improvements are that the contacting means is an endless circulating contacting means comprising either contact brushes or contact springs which co-run with the workpiece and grasp the lateral edges of the workpiece that project beyond the covering and that at least one cleaning device for cleaning the circulating contacting means is arranged in the region of a return run of the contact means.

The contact brushes or contact springs co-running with the workpiece have a particular advantage that they do not require any actuation devices at the beginning and the end of the conveying path and that they can be subjected to a cleaning in a return run of the circular configuration for the endless belt. The cathodic contacting of the workpiece can be decisively improved as a result of such a cleaning of the contact means.

When the contact brushes or the contact springs run synchronously with the workpiece, then no relative motion between the contact means and the workpiece is established. Thus, the problems with wear and/or abrasion of the contact means are avoided.

According to the preferred development of the invention, the contact brushes are in the form of an endless circulating brush band. The brush band slides on a live rail arranged on the backside in the contacting region.

An extremely reliable cathodic contacting of the workpiece can also be achieved in that the contact springs lying opposite one another in pairs are secured on the endless circulating metal band, and these contact springs press resiliently against the upper surface and the lower surface of the workpiece.

A further preferred development of the invention is characterized by the cleaning means fashioned as an electrolytic demetallization cell. An especially reliable electro-chemical deplating of the contact means during the return run of the continuous belt is thereby achieved.

A further considerable reduction in the structural outlay of the overall electroplating apparatus is achieved by the conveyor means composed of an upper band drive and a lower band drive for a friction actuated entrainment of the workpiece between a lower run of the upper band drive and an upper run of the lower band drive, whereby a sealing wall is respectively arranged between each of the upper runs and lower runs of each of the band drives. An especially effective shielding of the contact mechanism is, thus, undertaken here by sealing bands firmly pressed against the surface of the workpiece whereby the sealing bands simultaneously effect the friction-actuated entrainment of the workpieces as conveyor elements.

Other advantages and features of the invention will be readily apparent from the following description of the preferred embodiments, the drawings and claims.

BRIEF DESCRIPTION OF THE DRAWINGS

FIG. 1 is a perspective view partially broken away with portions in elevation for purposes of illustration of an electroplating apparatus utilizing an endless circulating brush band for cathodic contacting of the printed circuit board conducted in a horizontal path in accordance with the present invention;

FIG. 2 is a partial perspective view with portions broken away of a modification of the endless circulating band having pairs of contact springs attached thereto.

DESCRIPTION OF THE PREFERRED EMBODIMENTS

The principles of the present invention are particularly useful in an electroplating apparatus having a horizontal throughput system for the through-contacting and electroplating of printed circuit boards Lp. It may be seen that the two end walls of the bath container Bb are provided with horizontal slots Sz at the level of a horizontal throughput path indicated by the arrows Pfl, and these slots Sz enable the passage of the printed circuit boards Lp. The interior between an upper terminating hood (not shown in detail in FIG. 1) and the bath container Bb, which accepts an electrolyte solution, is provided with an extractor Ag at one side that is connected to a central extraction means for generating an under-pressure or suction in the space not containing the actual bath. A drive shaft Aw extends in a longitudinal direction beneath the extractor Ag and this drive shaft Aw drives end rollers Ur via a beveled gear arrangement (not shown in greater detail).

Each of the rollers Ur belong to laterally arranged conveyor means Te that convey the printed circuit board Lp through the electrolyte solution in the direction of arrows Pfl. Each of these conveyor means Te is arranged on both sides of the throughput path Pfl is composed of an upper band drive Bto and a lower band drive Btu. Each of the two band drives comprises a band B circulating endlessly over two rollers Ur, which are arranged at a distance from one another and, thus, have an upper path or run and a lower path or run. The band drives are each driven via the drive shaft Aw so that the printed circuit board Lp entering through the slot Sz that is in the front end, as taken in the direction of the arrows Pfl, is respectively drawn in between the band drives Bto and Btu and is entrained in a frictional-actuated fashion for movement in the direction of the arrows Pfl between the horizontal, lower run of the upper band drives Bto and the upper run of the lower band drive Btu.

In the lateral regions of the printed circuit board Lp, the band thereby lies tightly against the upper surface and against the lower or under surface over the entire length so that no electrolyte solution can pass through between the band B and the printed circuit board Lp. An upper plate Po that extends transversely relative to the throughput direction Pfl is arranged between the two upper runs of the upper band drives Bto and this upper plate Po has the upper runs pressing tightly against this upper surface. Sealing walls Dw extend beneath the underside of this upper plate Po and the lower runs of the upper band drives Bto. In a similar fashion, the lower runs of the lower band drives Btu have their undersides lying tightly against a floor Bo of the bath container Bp and have their upper surfaces lying tightly against a lower plate Pu extending transversely relative to the throughput direction Pfl. Sealing walls Dw are arranged between the lower plate Pu and the upper runs of the lower band drives Btu. It, thus, may be seen without further ado that the upper band drives Bto and the lower band drives Btu in combination with the upper plate Po or, respectively, the lower plate Pu and the sealing walls Dw form a shielding or, respectively, covering that at least largely prevents a lateral emergence of electrolyte solution.

Also illustrated in FIG. 1 is that a horizontally disposed, upper anode Ao that is composed of a basket of expanded metal and contains spherical anode material. This anode Ao is situated between the sealing walls Dw at a slight distance above the throughput path Pfl. In order to be able to replace the anode material, the upper plate Po is provided with an opening that can be closed by a cover De.

A lower anode Au that is, likewise, horizontally aligned and is fashioned as a sieve of expanded metal, for example is composed of a platinum-plated titanium, is arranged at a slight distance under the printed circuit board Lp. In contrast to the upper anode Ao that, for example, contains copper balls as the anode material, the lower anode Au is, thus, an insoluble anode.

The lateral delivery of electrolyte solution (not shown in FIG. 1) into the sealed region of the bath container and the discharge via the discharge connectors introduced into the floor Bo are dimensioned so that an upwardly directed flow, indicated by arrows Pf2, extend through the through-contacting holes Dk of the printed circuit board Lp. Insofar as other conditions are satisfied, this flow guarantees a qualitatively high-grade voltaic reinforcement or plating of the through-contacts.

The cathodic contacting of the printed circuit board Lp occurs via a contacting mechanism or means Kvl that is arranged at the right in the throughput direction Pfl. The contacting means Kvl grasp the lateral edges of the printed circuit board Lp that project beyond the conveyor means Te. A second contacting means Kvl that cannot be seen in FIG. 1 is expediently arranged on the left-hand side of the throughput path Pfl. The contacting means Kvl comprises brushes Kb in the form of a brush band circulating endlessly over two rollers Ro. The back roller Ro that can be seen in FIG. 1 is thereby driven in such a direction of the arrow Pf3 that the brush band comprising the contact brushes Kb synchronously co-run with the printed circuit board Lp. The delivery of the cathode current occurs by a stationarily arranged, live rail Ss on which the brush band gliding and from the contact brushes Kb of the brush band onto the upper side and onto the underside of the respective printed circuit boards Lp.

Should undesirable metal deposition and agglomeration form on the contact brushes Kb, due to a potentially emerging electrolyte solution, then these are, in turn, removed in a region of a return run or path of the brush band with a cleaning mechanism RE. The cleaning mechanism RE is fashioned as an electrolyte demetallization cell that contains an electrolyte solution, which is preferably the electrolyte solution employed for electroplating. The demetallization then occurs with an anodic contacting of the brush band relative to a cathode situated in the cleaning mechanism RE.

In FIG. 2, an embodiment of the contacting means is illustrated at Kv2, which synchronously co-runs with the printed circuit boards Lp. This contact means Kv2 is formed by a plurality of contact spring pairs which are secured at a given distance from one another on an endless circulating metal band Mb. Each contact spring pair is composed of an upper contact spring Kfo and a lower contact spring Kfu, which lie opposite each other and between which the lateral edge of the printed circuit board is accepted while maintaining a certain resilient contact pressure. The power supply to the metal band Mb occurs by a live rail Ss, which is arranged stationarily at a backside and via brushes Brs, which extend between the rail and the band Mb. Of course a supply via springs would also be possible. The live rail Ss is preferably formed by a titanium cladded, solid copper conductor. The brushes Brs are preferably composed of copper, whereas titanium has proven very good as a material for the metal band Mb and for the contact springs Kfo and Kfu. A cleaning or, respectively, demetallization of the contact springs Kfo and Kfu, according to the principles illustrated in FIG. 1, are also possible by passing the contact pairs through a cleaning means, such as RE, on the return run or leg of the path of the band.

Although various minor modifications may be suggested by those versed in the art, it should be understood that I wish to embody within the scope of the patent granted hereon all such modifications as reasonably and properly come within the scope of my contribution to the art.

I claim:

1. In an electroplating apparatus for plate-shaped workpieces, said apparatus having conveying means for conveying a workpiece through a container of an electrolytic solution in a horizontal path, each container having means for sealing a lateral edge of the workpiece from the electrolyte as the workpiece is conveyed through the container and contact means being arranged for engaging the exposed edge of the workpiece, the improvements comprising said contacting means being an endless circulating belt arrangement co-running with the workpiece, said belt arrangement having one run extending adjacent the edge of the workpiece and a return run, said contacting means including cleaning means for cleaning the circulating contact means arranged in the region of the return run.

2. An electroplating apparatus according to claim 1, wherein the contact means includes contact brushes engaging the edge of said workpiece.

3. An electroplating apparatus according to claim 2, wherein the contact brushes synchronously co-run with the workpiece.

4. An electroplating apparatus according to claim 2, wherein the contact brushes are disposed on one side of the endless moving band, said band gliding along a live rail arranged on the backside of the run adjacent said edges of the workpiece.

5. An electroplating apparatus according to claim 2, wherein the cleaning means is constructed as an electrolytic demetallization cell.

6. An electroplating apparatus according to claim 2, wherein the conveyor means is composed of an upper band drive and a lower band drive for frictional-actuated entrainment of the workpiece between a lower run of the upper band drive and an upper run of the lower band drive, said means for sealing the fluid including sealing walls extending between the upper and lower runs of each of the upper and lower band drives.

7. An electroplating apparatus according to claim 1, wherein said belt supports a plurality of contact springs for engaging the edge of the workpiece.

8. An electroplating apparatus according to claim 7, wherein the contact springs synchronously co-run with the workpiece.

9. An electroplating apparatus according to claim 7, wherein the contact means includes brushes extending between a surface of the belt opposite to the contact spring and a live rail in the run adjacent said edges to provide the cathodic contacting of the workpiece.

10. An electroplating apparatus according to claim 7, wherein each of the contact springs are arranged in pairs, said springs pressing resiliently against the upper surface and lower surface of the workpiece.

11. An electroplating apparatus according to claim 7, wherein the cleaning means is constructed as an electrolytic demetallization cell.

12. An electroplating apparatus according to claim 7, wherein the conveyor means is composed of an upper band drive and a lower band drive for frictional-actuated entrainment of the workpiece between a lower run of the upper band drive and an upper run of the lower band drive, said bands coacting with sealing walls to form means for sealing the lateral edges of the workpiece from the electrolyte.

* * * * *